US009528666B2

United States Patent
Harbers et al.

(10) Patent No.: US 9,528,666 B2
(45) Date of Patent: Dec. 27, 2016

(54) INTEGRATED LED BASED ILLUMINATION DEVICE

(71) Applicant: Xicato, Inc., San Jose, CA (US)

(72) Inventors: Gerard Harbers, Sunnyvale, CA (US); Tyler Robin Kakuda, Stockton, CA (US); Serge J. A. Bierhuizen, San Jose, CA (US); Stefan Eberle, Mountain View, CA (US)

(73) Assignee: Xicato, Inc., San Jose, CA (US)

( * ) Notice: Subject to any disclaimer, the term of this patent is extended or adjusted under 35 U.S.C. 154(b) by 0 days.

(21) Appl. No.: 14/937,722

(22) Filed: Nov. 10, 2015

(65) Prior Publication Data

US 2016/0061392 A1 Mar. 3, 2016

Related U.S. Application Data

(62) Division of application No. 14/017,201, filed on Sep. 3, 2013.

(Continued)

(51) Int. Cl.
*F21V 3/04* (2006.01)
*F21K 99/00* (2016.01)
(Continued)

(52) U.S. Cl.
CPC . *F21K 9/56* (2013.01); *F21K 9/00* (2013.01); *F21K 9/64* (2016.08); *F21V 3/0481* (2013.01);
(Continued)

(58) Field of Classification Search
CPC ........... H01L 2924/0002; H01L 33/644; H01L 2933/0058; H01L 33/507; H01L 2933/0075; H01L 33/504; H01L 33/60; H01L 25/0753; F21V 19/0015; F21V 29/74; F21V 31/005; F21V 3/0481; F21V 13/04; F21V 7/0083; F21Y 2113/005; F21Y 2105/001; F21Y 2101/02; F21K 9/56; F21K 9/00
See application file for complete search history.

(56) References Cited

U.S. PATENT DOCUMENTS 5,959,316 A 9/1999 Lowery
6,351,069 B1 2/2002 Lowery et al.
(Continued)

FOREIGN PATENT DOCUMENTS

EP 2 196 724 A2 6/2010
EP 2 282 340 A2 2/2011
(Continued)

OTHER PUBLICATIONS

Invitation to Pay Additional Fees mailed on Jan. 7, 2014 for PCT Application No. PCT/US2013/058529 filed on Sep. 6, 2013 by Xicato, Inc., 7 pages.
(Continued)

*Primary Examiner* — Donald Raleigh
*Assistant Examiner* — Kevin Quarterman
(74) *Attorney, Agent, or Firm* — Silicon Valley Patent Group LLP

(57) ABSTRACT

A light emitting diode (LED) based illumination device include a plurality of LEDS mounted to mounting board and includes a transmissive plate disposed above the LEDs. The transmissive plate includes an amount of wavelength converting material configured to change a wavelength of an amount of light emitted by the plurality of LEDs. A base reflector structure is coupled to the LED mounting board and the transmissive plate between at least two of the LEDs. In another configuration, a dam of reflective material surrounds the LEDs and is coupled to the LED mounting board and the transmissive plate, while a dam of thermally conductive material surrounds the dam of reflective material. In another
(Continued)

configuration, the LED mounting board has a protrusion of thermally conductive material that surrounds the LEDs and is coupled to the transmissive plate, and has a void on the side opposite the protrusion.

5 Claims, 9 Drawing Sheets

Related U.S. Application Data

(60) Provisional application No. 61/697,712, filed on Sep. 6, 2012, provisional application No. 61/790,887, filed on Mar. 15, 2013.

(51) Int. Cl.
| | |
|---|---|
| *H01L 25/075* | (2006.01) |
| *F21V 29/74* | (2015.01) |
| *F21V 19/00* | (2006.01) |
| *F21V 31/00* | (2006.01) |
| *F21V 7/00* | (2006.01) |
| *F21V 13/04* | (2006.01) |
| *H01L 33/50* | (2010.01) |
| *H01L 33/60* | (2010.01) |
| *H01L 33/64* | (2010.01) |
| *F21Y 101/00* | (2016.01) |

(52) U.S. Cl.
CPC ............ *F21V 19/0015* (2013.01); *F21V 29/74* (2015.01); *F21V 31/005* (2013.01); *H01L 25/0753* (2013.01); *F21V 7/0083* (2013.01); *F21V 13/04* (2013.01); *F21Y 2101/00* (2013.01); *F21Y 2105/10* (2016.08); *F21Y 2113/13* (2016.08); *F21Y 2115/10* (2016.08); *H01L 33/504* (2013.01); *H01L 33/507* (2013.01); *H01L 33/60* (2013.01); *H01L 33/644* (2013.01); *H01L 2924/0002* (2013.01); *H01L 2933/0058* (2013.01); *H01L 2933/0075* (2013.01)

(56) References Cited

U.S. PATENT DOCUMENTS

| | | | |
|---|---|---|---|
| 6,504,301 | B1 | 1/2003 | Lowery |
| 6,586,882 | B1 | 7/2003 | Harbers |
| 6,600,175 | B1 | 7/2003 | Baretz et al. |
| 6,680,569 | B2 | 1/2004 | Mueller-Mach et al. |
| 6,812,500 | B2 | 11/2004 | Reeh et al. |
| 7,126,162 | B2 | 10/2006 | Reeh et al. |
| 7,250,715 | B2 | 7/2007 | Mueller et al. |
| 7,479,662 | B2 | 1/2009 | Soules et al. |
| 7,564,180 | B2 | 7/2009 | Brandes |
| 7,614,759 | B2 | 11/2009 | Negley |
| 7,629,621 | B2 | 12/2009 | Reeh et al. |
| 8,508,127 | B2 | 8/2013 | Negley et al. |
| 2007/0081336 | A1 | 4/2007 | Bierhuizen et al. |
| 2008/0285275 | A1 | 11/2008 | Ijzerman |
| 2009/0322197 | A1* | 12/2009 | Helbing ................ H01L 33/507 313/46 |
| 2010/0140655 | A1 | 6/2010 | Shi |
| 2010/0163898 | A1 | 7/2010 | Hung et al. |
| 2011/0221330 | A1 | 9/2011 | Negley et al. |
| 2011/0227108 | A1 | 9/2011 | Tetz et al. |
| 2011/0254039 | A1 | 10/2011 | Kim et al. |
| 2012/0002396 | A1 | 1/2012 | Tseng et al. |
| 2014/0003044 | A1 | 1/2014 | Harbers et al. |

FOREIGN PATENT DOCUMENTS

| | | |
|---|---|---|
| EP | 2 492 577 A2 | 8/2012 |
| JP | 2008-147610 A | 6/2008 |
| WO | WO 2009/133870 A1 | 11/2009 |

OTHER PUBLICATIONS

International Search Report and Written Opinion mailed on Apr. 2, 2014 for PCT Application No. PCT/US2013/058529 filed on Sep. 6, 2013 by Xicato, Inc., 18 pages.

Patent Abstracts of Japan in English for JP 2008-147610-A published on Jun. 26, 2008, 1 page.

\* cited by examiner

INTEGRATED LED BASED ILLUMINATION DEVICE

CROSS REFERENCE TO RELATED APPLICATIONS

This application is a divisional of and claims priority to U.S. application Ser. No. 14/017,201, filed Sep. 3, 2013, which claims priority under 35 USC §119 to both U.S. Provisional Application No. 61/697,712, filed Sep. 6, 2012, and U.S. Provisional Application No. 61/790,887, filed Mar. 15, 2013, all of which are incorporated by reference herein in their entireties.

TECHNICAL FIELD

The described embodiments relate to illumination modules that include Light Emitting Diodes (LEDs).

BACKGROUND

The use of light emitting diodes in general lighting is still limited due to limitations in light output level or flux generated by the illumination devices. Illumination devices that use LEDs also typically suffer from poor color quality characterized by color point instability. The color point instability varies over time as well as from part to part. Poor color quality is also characterized by poor color rendering, which is due to the spectrum produced by the LED light sources having bands with no or little power. Further, illumination devices that use LEDs typically have spatial and/or angular variations in the color. Additionally, illumination devices that use LEDs are expensive due to, among other things, the necessity of required color control electronics and/or sensors to maintain the color point of the light source or using only a small selection of produced LEDs that meet the color and/or flux requirements for the application.

Consequently, improvements to illumination device that uses light emitting diodes as the light source are desired.

SUMMARY

A light emitting diode (LED) based illumination device include a plurality of LEDS mounted to mounting board and includes a transmissive plate disposed above the LEDs. The transmissive plate includes an amount of wavelength converting material configured to change a wavelength of an amount of light emitted by the plurality of LEDs. A base reflector structure is coupled to the LED mounting board and the transmissive plate between at least two of the LEDs. In another configuration, a dam of reflective material surrounds the LEDs and is coupled to the LED mounting board and the transmissive plate, while a dam of thermally conductive material surrounds the dam of reflective material. In another configuration, the LED mounting board has a protrusion of thermally conductive material that surrounds the LEDs and is coupled to the transmissive plate, and has a void on the side opposite the protrusion.

Further details and embodiments and techniques are described in the detailed description below. This summary does not define the invention. The invention is defined by the claims.

DETAILED DESCRIPTION

Reference will now be made in detail to background examples and some embodiments of the invention, examples of which are illustrated in the accompanying drawings.

Figure 1:
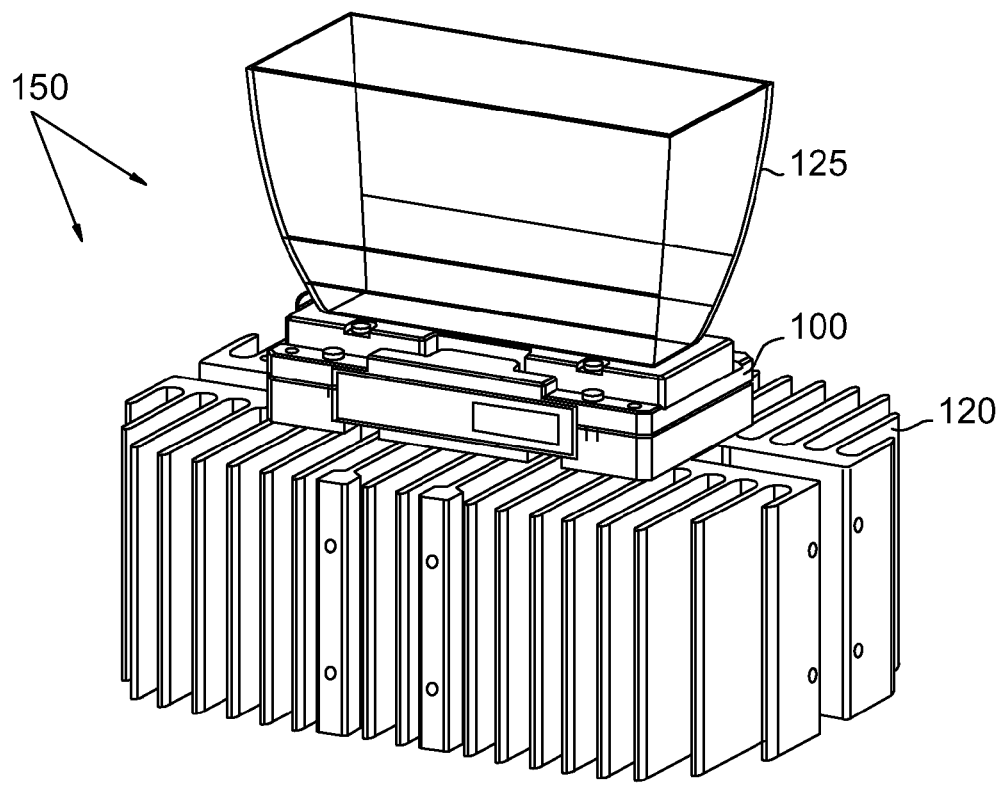
FIGS. 1, 2, and 3 illustrate three exemplary luminaires, including an illumination device, reflector, and light fixture.
Figure 2:
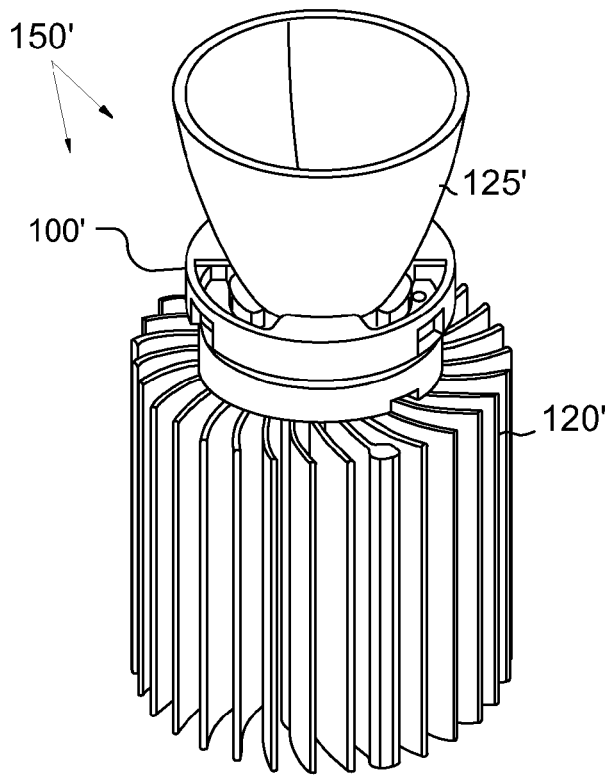
Figure 3:
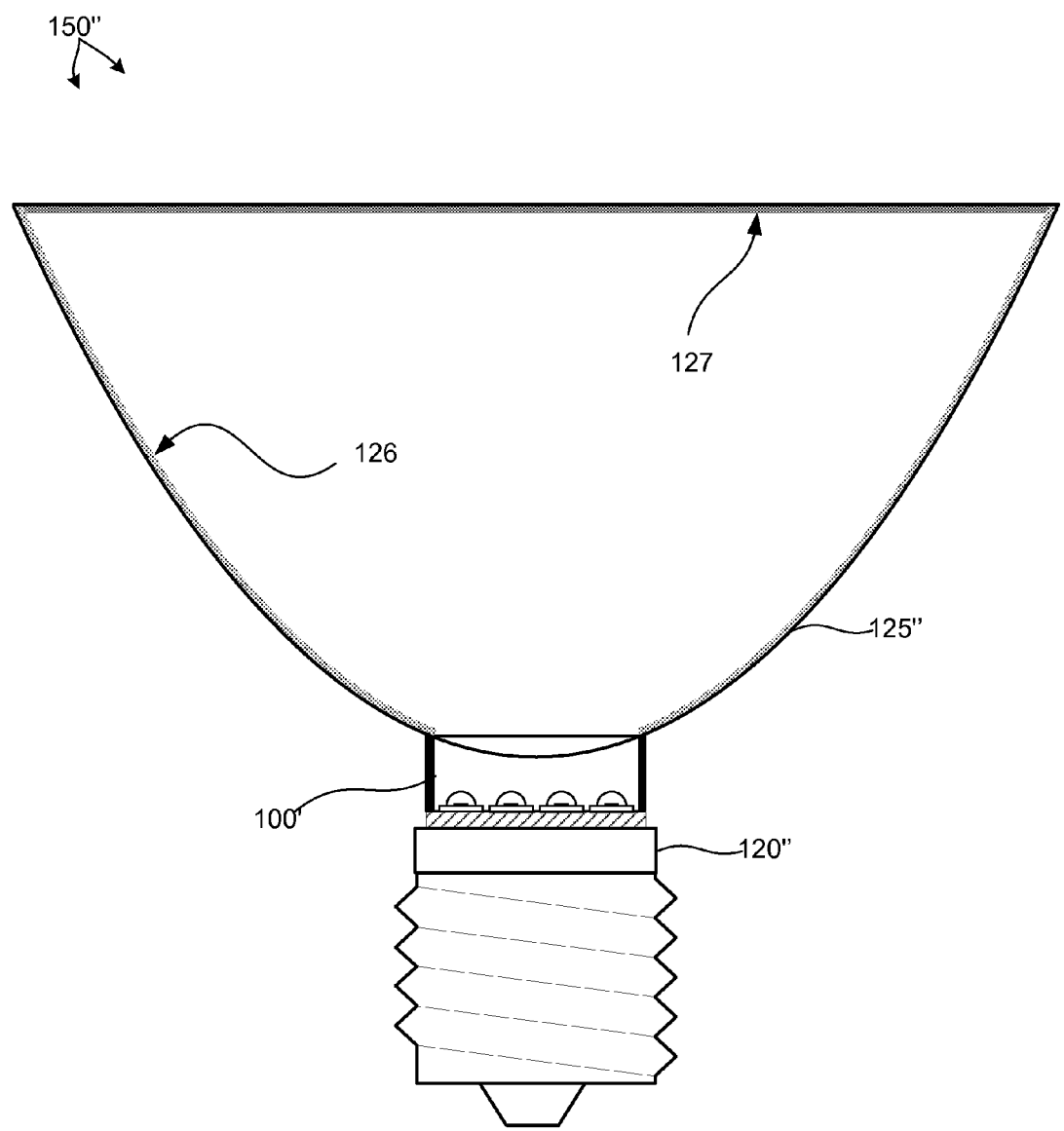

FIGS. 1, 2, and 3 illustrate three exemplary luminaires, labeled 150, 150', and 150", which are sometimes collectively referred to as luminaire 150. The luminaire illustrated in FIG. 1 includes an LED based illumination device 100 with a rectangular form factor. The luminaire illustrated in FIG. 2 includes an LED based illumination device 100' with a circular form factor. The luminaire illustrated in FIG. 3 includes an LED based illumination device 100' integrated into a retrofit lamp device. These examples are for illustrative purposes. Examples of LED based illumination devices of general polygonal and elliptical shapes may also be contemplated, and in general, LED based illumination devices 100 and 100' may be collectively referred to as LED based illumination device 100. As illustrated in FIG. 1, luminaire 150 includes illumination device 100, reflector 125, and light fixture 120. FIG. 2 shows luminaire 150' with illumination device 100', reflector 125', and light fixture 120' and FIG. 3 shows luminaire 150" with illumination device 100', reflector 125", and light fixture 120". Reflectors 125, 125', and 125" are sometimes collectively referred to herein as reflector 125, and light fixtures 120, 120', and 120" are sometimes collectively referred to herein as light fixture 120. As depicted, light fixture 120 includes a heat sink capability, and therefore may be sometimes referred to as heat sink 120. However, light fixture 120 may include other structural and decorative elements (not shown). Reflector 125 is mounted to illumination device 100 to collimate or deflect light emitted from illumination device 100. The reflector 125 may be made from a thermally conductive material, such as a material that includes aluminum or copper and may be thermally coupled to illumination device 100. Heat flows by conduction through illumination device 100 and the thermally conductive reflector 125. Heat also flows via thermal convection over the reflector 125. Reflector 125 may be a compound parabolic concentrator, where the concentrator is constructed of or coated with a highly reflecting material. Optical elements, such as a diffuser or reflector 125 may be removably coupled to illumination device 100, e.g., by means of threads, a clamp, a twist-lock mechanism, or other appropriate arrangement. As illustrated in FIG. 3, a reflector 125 may include sidewalls 126 and a window 127 that are optionally coated, e.g., with a wavelength converting material, diffusing material or any other desired material.

As depicted in FIGS. 1, 2, and 3, illumination device 100 is mounted to heat sink 120. Heat sink 120 may be made from a thermally conductive material, such as a material that includes aluminum or copper and may be thermally coupled to illumination device 100. Heat flows by conduction through illumination device 100 and the thermally conductive heat sink 120. Heat also flows via thermal convection over heat sink 120. Illumination device 100 may be attached to heat sink 120 by way of screw threads to clamp the illumination device 100 to the heat sink 120. To facilitate easy removal and replacement of illumination device 100, illumination device 100 may be removably coupled to heat sink 120, e.g., by means of a clamp mechanism, a twist-lock mechanism, or other appropriate arrangement. Illumination device 100 includes at least one thermally conductive surface that is thermally coupled to heat sink 120, e.g., directly or using thermal grease, thermal tape, thermal pads, or thermal epoxy. For adequate cooling of the LEDs, a thermal contact area of at least 50 square millimeters, but preferably 100 square millimeters should be used per one watt of electrical energy flow into the LEDs on the board. For example, in the case when 20 LEDs are used, a 1000 to 2000 square millimeter heat sink contact area should be used. Using a larger heat sink 120 may permit the LEDs 102 to be driven at higher power, and also allows for different heat sink designs. For example, some designs may exhibit a cooling capacity that is less dependent on the orientation of the heat sink. In addition, fans or other solutions for forced cooling may be used to remove the heat from the device. The bottom heat sink may include an aperture so that electrical connections can be made to the illumination device 100.

Light generated by LEDs in the LED based illumination device 100, is generally color converted to generate a desirable output light. Various embodiments are introduced herein to improve the light extraction efficiency from LED based illumination device 100 and to improve the dissipation of heat generated by the color conversion process. In one aspect a base reflector structure (shown in FIGS. 4-7, as base reflector structures 171, 171', 171", and 171''', and sometimes collectively referred to herein as base reflector structure 171) directs light emitted from LEDs 102 to a transmissive plate 174 (shown in FIGS. 4-7) coated with at least one wavelength converting material, illustrated as wavelength converting materials 180 and 181, and provides a direct thermal path between the transmissive plate 174 and an LED mounting board 104. In this manner, light extraction efficiency is improved by the same structure that provides a direct heat dissipation path from the transmissive plate to a heat sinking device.

Figure 4:
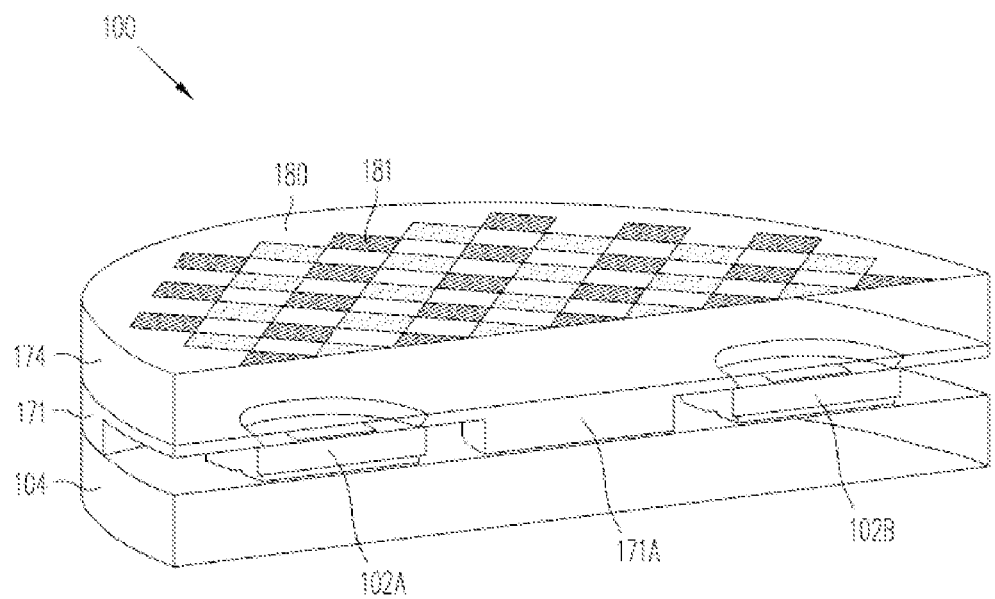
FIG. 4 illustrates a perspective cut-away view of components in an embodiment of an LED based illumination device including a base reflector structure that physically couples a transmissive plate and an LED mounting board.
Figure 5:
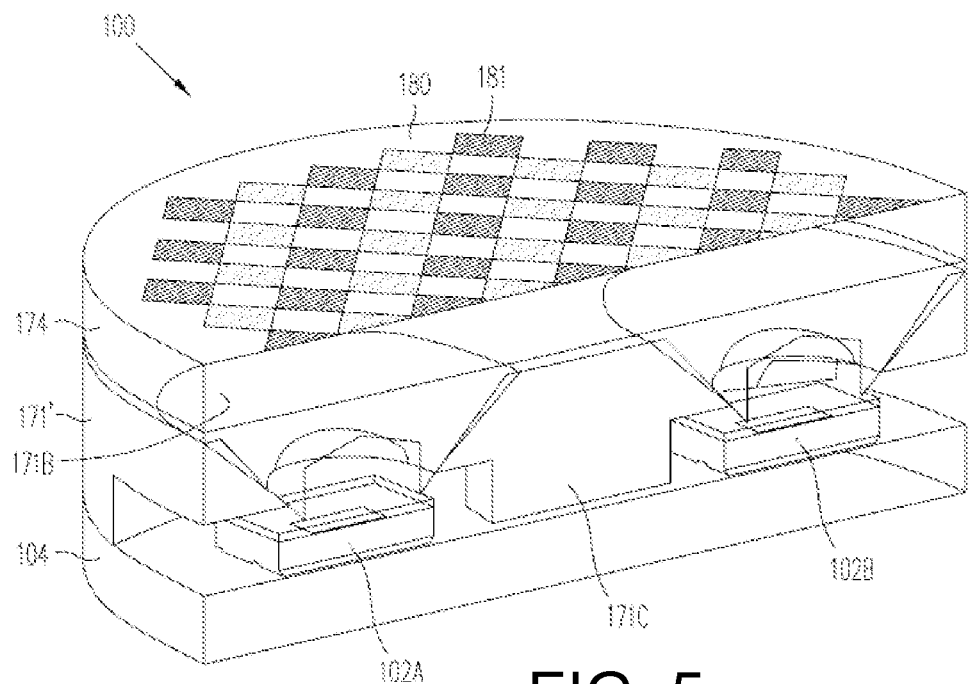
FIG. 5 illustrates a perspective cut-away view of components in another embodiment of an LED based illumination device including a base reflector structure that physically couples a transmissive plate and an LED mounting board.
Figure 6:
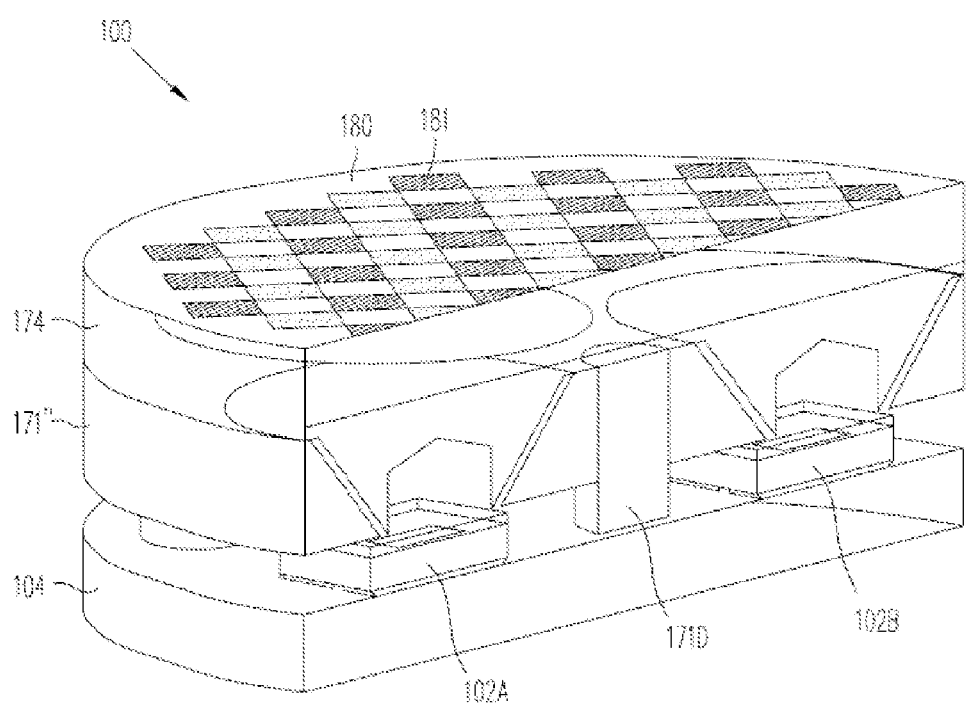
FIG. 6 illustrates a perspective cut-away view of components in another embodiment of an LED based illumination device including a base reflector structure that physically couples a transmissive plate and an LED mounting board.

FIGS. 4, 5, and 6 illustrate perspective cut-away views of components of various embodiments of LED based illumination device 100. It should be understood that FIGS. 4-6 illustrate the LED based illumination device 100 as having a circular form factor, such as that illustrated in FIG. 2, but other form factors may be used, including a rectangular form factor such as that shown in FIG. 1. It should be understood that as defined herein an LED based illumination device is not an LED, but is an LED light source or fixture or component part of an LED light source or fixture. For example, an LED based illumination device may be an LED based replacement lamp such as depicted in FIG. 3. LED based illumination device 100 includes one or more LED die or packaged LEDs and a mounting board to which LED die or packaged LEDs are attached. In one embodiment, the LEDs 102A and 102B, sometimes referred to herein as LEDs 102 are LED die electrically and mechanically coupled to LED board 104 in an arrangement commonly referred to as a Chip On Board (COB) configuration. In another embodiment, the LEDs 102A and 102B, sometimes collectively referred to herein as LEDs 102, are packaged LEDs, such as the Luxeon Rebel manufactured by Philips Lumileds Lighting. Other types of packaged LEDs may also be used, such as those manufactured by OSRAM (Oslon package), Luminus Devices (USA), Cree (USA), Nichia (Japan), or Tridonic (Austria). As defined herein, a packaged LED is an assembly of one or more LED die that contains electrical connections, such as wire bond connections or stud bumps, and possibly includes an optical element and thermal, mechanical, and electrical interfaces. The LED chip typically has a size about 1 mm by 1 mm by 0.5 mm, but these dimensions may vary. In some embodiments, the LEDs 102 may include multiple chips. The multiple chips can emit light of similar or different colors, e.g., red, green, and blue. LEDs 102 are mounted to mounting board 104. The light emitted from LEDs 102 is directed to transmissive plate 174. A thermally conductive base reflector structure 171 promotes heat dissipation from the transmissive plate 174 to the mounting board 104, upon which the LEDs 102 are mounted.

As depicted in FIGS. 4-6, base reflector structure 171 is in physical contact with transmissive plate 174 and mounting board 104. As illustrated in FIG. 4, base reflector structure 171 is shaped to direct light from LEDs 102 to transmissive plate 174. In addition, base reflector structure 171 includes a feature 171A that physically couples transmissive plate 174 and mounting board 104. As illustrated in FIG. 4, the feature 171A is located in the center of transmissive plate 174. Typically, the temperature is highest at the center of transmissive plate 174. However, by thermally coupling the center of transmissive plate 174 with mounting board 104 with base reflector structure 171, the temperature at the center of transmissive plate 174 is reduced by inducing heat flow from the center of transmissive plate 174 to mounting board 104. Base reflector structure 171 may thermally couple the bottom surface of transmissive plate 174 with mounting board 104 in any number of locations. In some examples, a number of contact points may be distributed over the surface of transmissive plate 174. In these examples, locations are selected to minimize the impact on the output beam uniformity of LED based illumination device 100 while minimizing the thermal gradient across the surface of transmissive plate 174.

FIG. 5 illustrates LED based illumination device 100 with the base reflector structure 171'. As illustrated, the base reflector structure 171' includes deep reflector surfaces 171B that direct light emitted from LEDs 102 to transmissive plate 174. In addition, base reflector structure 171' includes a centrally located feature 171C that thermally connects transmissive plate 174 and mounting board 104. As illustrated, base reflector structure 171' is constructed from one part to minimize manufacturing complexity.

As illustrated in FIG. 6, base reflector structure 171" includes a thermally conductive insert 171D that thermally couples transmissive plate 174 and mounting board 104. In this manner, base reflector structure may be constructed from a low cost material (e.g., plastic) and the thermally conductive insert 171C may be constructed from a material optimized for thermal conductivity (e.g., aluminum or copper).

As depicted in FIGS. 4-6, base reflector structure 171 is in physical contact with transmissive plate 174 and mounting board 104. However, in some other embodiments, base reflector structure 171 may be in physical contact with transmissive plate 174 and heat sink 120. In this manner, a more direct thermal path between transmissive plate 174 and heat sink 120 is realized. In one example, elements of base reflector structure 171 may be configured to pass through voids in LED board 104 to directly couple transmissive plate 174 to heat sink 120.

Base reflector structure 171 may have a high thermal conductivity to minimize thermal resistance. By way of example, base reflector structure 171 may be made with a highly thermally conductive material, such as an aluminum based material that is processed to make the material highly reflective and durable. By way of example, a material referred to as Miro®, manufactured by Alanod, a German company, may be used.

The optical surfaces of base reflector structure 171 may be treated to achieve high reflectivity. For example the optical surface of base reflector structure 171 may be polished, or covered by one or more reflective coatings (e.g., reflective materials such as Vikuiti™ ESR, as sold by 3M (USA), Lumirror™ E60L manufactured by Toray (Japan), or microcrystalline polyethylene terephthalate (MCPET) such as that manufactured by Furukawa Electric Co. Ltd. (Japan), a polytetrafluoroethylene PTFE material such as that manufactured by W.L. Gore (USA) and Berghof (Germany)). Also, highly diffuse reflective coatings can be applied to optical surfaces of base reflector structure 171. Such coatings may include titanium dioxide ($TiO_2$), zinc oxide (ZnO), and barium sulfate ($BaSO_4$) particles, or a combination of these materials.

In some embodiments, base reflector structure 171 may be constructed from or include a reflective, ceramic material, such as ceramic material produced by CerFlex International (The Netherlands). In some embodiments, portions of any of the optical surfaces of base reflector structure 171 may be coated with a wavelength converting material.

Figure 7:
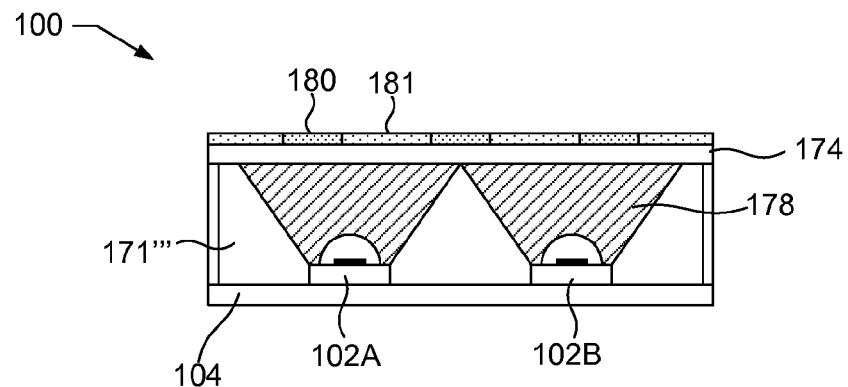
FIG. 7 illustrates a side view of components in another embodiment of an LED based illumination device with a total internal reflection (TIR) lens structure to direct light emitted from LEDs to a transmissive plate.

FIG. 7 is illustrative of another configuration of LED based illumination device 100, which is similar to that shown in FIGS. 4-6, like designated elements being the same. As illustrated in FIG. 7, LED based illumination device 100 may include a total internal reflection (TIR) lens structure 178 to direct light emitted from LEDs 102 to transmissive plate 174.

Figure 8:
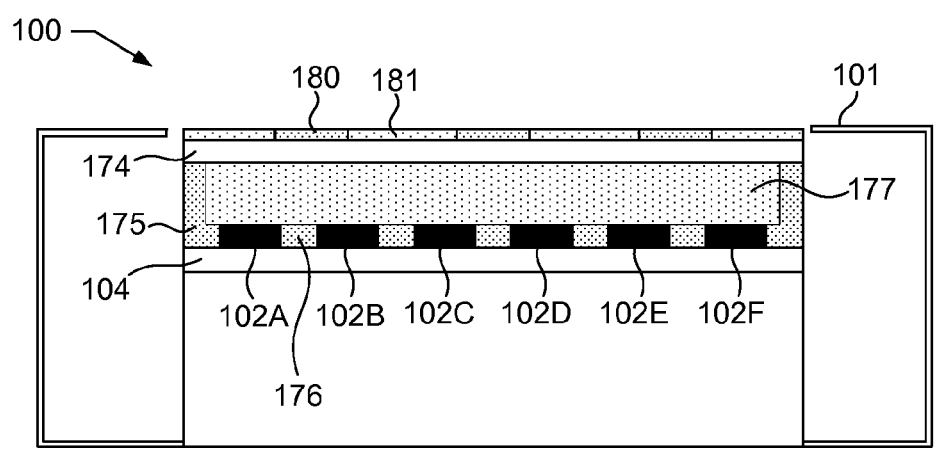
FIG. 8 illustrates a side view of components in another embodiment of an LED based illumination device with a dam of reflective material surrounding the LEDs and supporting a transmissive plate.

FIG. 8 is illustrative of another configuration of LED based illumination device 100, which is similar to that shown in FIGS. 4-6, like designated elements being the same. As illustrated in FIG. 8, LED based illumination device 100 includes a housing 101 including mechanical features to interface LED based illumination device 100 with a heat sink (e.g., heat sinks 120, 120', and 120" illustrated in FIGS. 1-3, respectively). In some embodiments housing 101 includes a fastening means (e.g., screws, spring clips, clamps, etc.) to fasten LED based illumination device 100 to a heat sink. In addition to providing a means of fastening LED based illumination device 100 to a heat sink, housing 101 also protects sensitive components of LED based illumination device 100 (e.g., LEDs, electronics, etc.) from damage during installation and operation in lighting applications. As such, housing 101 may be constructed from a suitably durable material (e.g., metal, plastic, fiber-reinforced plastic, etc.). As can be seen, the components of the LED based illumination device 100 are disposed within the housing with the transmissive plate 174 located at an output port of the housing 101. Housing 101 may be used with any of the LED based illumination devices discussed herein.

As illustrated in FIG. 8, LED based illumination device 100 includes a number of LEDs 102A-F, collectively referred to as LEDs 102, arranged in a chip on board (COB) configuration. LED based illumination device 100 also includes a base reflector structure including a reflective material 176 disposed in the spaces between each LED and a dam of reflective material 175 that surrounds the LEDs 102 and supports transmissive plate 174. In some examples, reflective materials 175 and 176 are a white, highly reflective silicone-based material. The silicone-based material is a flowable material that is dispensed between and around LEDs 102 in a viscous state. After curing, the material assumes a permanent shape. In some other examples, reflective materials 175 and 176 are rigid structural materials having highly reflective properties (e.g., a PTFE based material, a coated aluminum material, etc.). In the embodiment depicted in FIG. 8, the space between LEDs 102 and transmissive plate 174 is filled with an encapsulating optically translucent material 177 (e.g., silicone) to promote light extraction from LEDs 102 and to separate LEDs 102 from the environment. In the depicted embodiment, the dam of reflective material 175 is both the thermally conductive structure that conducts heat from transmissive plate 174 to LED mounting board 104 and the optically reflective structure that reflects incident light from LEDs 102 toward transmissive plate 174.

In another aspect, a shaped lens element is optically coupled to LEDs 102 and thermally coupled to LED mounting board 104. The shaped lens element may include at least one wavelength converting material. In this manner, light extraction efficiency is improved by the shaped lens element and heat generated by the wavelength converting material on the shaped lens element has a direct thermal path to a heat sinking device.

Figure 9:
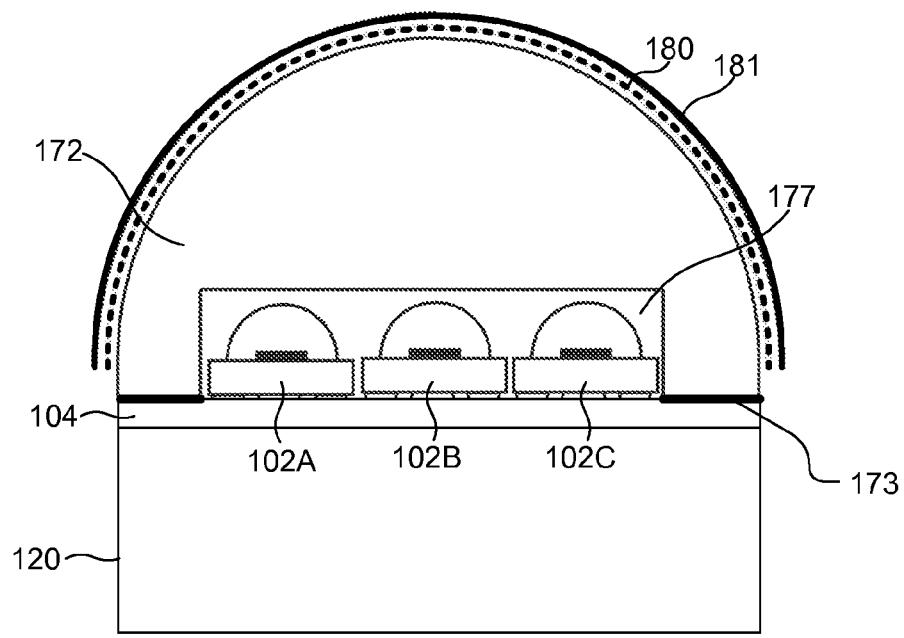
FIG. 9 illustrates a side view of components in another embodiment of an LED based illumination device with a shaped lens disposed over the LEDs and thermally coupled to the LED mounting board.

FIG. 9 is illustrative of another configuration of LED based illumination device 100, which is similar to that shown in FIGS. 4-6, like designated elements being the same. As illustrated, LED based illumination device 100 includes a shaped lens 172 disposed over LEDs 102A, 102B, and 102C, collectively referred to as LEDs 102. As illustrated, shaped lens 172 includes at least one wavelength converting material at the light emitting surface of shaped lens 172. Shaped lens 172 is directly coupled to mounting board 104 to promote heat flow from shaped lens 172 to mounting board 104. In this manner, heat generated by color conversion on surfaces of shaped lens 172 is efficiently transferred to mounting board 104 and removed from LED based illumination device 100 via heat sink 120. In some other embodiments, shaped lens 172 is directly coupled to heat sink 120. In one example, elements of a base reflector structure, such as base reflector structure 171 discussed above, may be configured to pass through voids in LED board 104 to directly couple shaped lens 172 to heat sink 120.

LEDs 102 can emit different or the same colors, either by direct emission or by phosphor conversion, e.g., where phosphor layers are applied to the LEDs as part of the LED package. The illumination device 100 may use any combination of colored LEDs 102, such as red, green, blue, amber, or cyan, or the LEDs 102 may all produce the same color light. Some or all of the LEDs 102 may produce white light. In addition, the LEDs 102 may emit polarized light or non-polarized light and LED based illumination device 100 may use any combination of polarized or non-polarized LEDs. In some embodiments, LEDs 102 emit either blue or UV light because of the efficiency of LEDs emitting in these wavelength ranges. The light emitted from the illumination device 100 has a desired color when LEDs 102 are used in combination with wavelength converting materials on transmissive plate 174 or shaped lens 172, for example. By tuning the chemical and/or physical (such as thickness and concentration) properties of the wavelength converting materials and the geometric properties of the coatings on the surfaces of transmissive plate 174 or shaped lens 172, specific color properties of light output by LED based illumination device 100 may be specified, e.g., color point, color temperature, and color rendering index (CRI).

For purposes of this patent document, a wavelength converting material is any single chemical compound or mixture of different chemical compounds that performs a color conversion function, e.g., absorbs an amount of light of one peak wavelength, and in response, emits an amount of light at another peak wavelength.

By way of example, phosphors may be chosen from the set denoted by the following chemical formulas: Y3Al5O12: Ce, (also known as YAG:Ce, or simply YAG) (Y,Gd) 3Al5O12:Ce, CaS:Eu, SrS:Eu, SrGa2S4:Eu, Ca3(Sc,Mg) 2Si3O12:Ce, Ca3Sc2Si3O12:Ce, Ca3Sc2O4:Ce, Ba3Si6O12N2:Eu, (Sr,Ca)AlSiN3:Eu, CaAlSiN3:Eu, CaAlSi(ON)3:Eu, Ba2SiO4:Eu, Sr2SiO4:Eu, Ca2SiO4:Eu, CaSc2O4:Ce, CaSi2O2N2:Eu, SrSi2O2N2:Eu, BaSi2O2N2:Eu, Ca5(PO4)3Cl:Eu, Ba5(PO4)3Cl:Eu, Cs2CaP2O7, Cs2SrP2O7, Lu3Al5O12:Ce, Ca8Mg(SiO4) 4Cl2:Eu, Sr8Mg(SiO4)4Cl2:Eu, La3Si6N11:Ce, Y3Ga5O12:Ce, Gd3Ga5O12:Ce, Tb3Al5O12:Ce, Tb3Ga5O12:Ce, and Lu3Ga5O12:Ce.

In one example, the adjustment of color point of the illumination device may be accomplished by adding or removing wavelength converting material from transmissive plate 174 or shaped lens 172, which similarly may be coated or impregnated with one or more wavelength converting materials. In one embodiment a red emitting phosphor 181 such as an alkaline earth oxy silicon nitride covers a portion of transmissive plate 174 or shaped lens 172, and a yellow emitting phosphor 180 such as YAG covers another portion of transmissive plate 174 or shaped lens 172, as illustrated in FIGS. 4-9.

In some embodiments, the phosphors are mixed in a suitable solvent medium with a binder and, optionally, a surfactant and a plasticizer. The resulting mixture is deposited by any of spraying, screen printing, blade coating, jetting, or other suitable means. By choosing the shape and height of the transmissive plate 174 or shaped lens 172, and selecting which portions of transmissive plate 174 or shaped lens 172 will be covered with a particular phosphor or not, and by optimization of the layer thickness and concentration of a phosphor layer on the surfaces, the color point of the light emitted from the device can be tuned as desired.

In one example, a single type of wavelength converting material may be patterned on a portion of transmissive plate 174 or shaped lens 172. By way of example, a red emitting phosphor 181 may be patterned on different areas of the transmissive plate 174 or shaped lens 172 and a yellow emitting phosphor 180 may be patterned on other areas of transmissive plate 174 or shaped lens 172. In some examples, the areas may be physically separated from one another. In some other examples, the areas may be adjacent to one another. The coverage and/or concentrations of the phosphors may be varied to produce different color temperatures. It should be understood that the coverage area of the red and/or the concentrations of the red and yellow phosphors will need to vary to produce the desired color temperatures if the light produced by the LEDs 102 varies. The color performance of the LEDs 102, red phosphor and the yellow phosphor may be measured and modified by any of adding or removing phosphor material based on performance so that the final assembled product produces the desired color temperature. In some examples, the color of an assembled LED based illumination device is measured after final assembly and an appropriate change in phosphor content to reach the desired color temperature is determined based on the measured color. The appropriate change in phosphor content can be realized by either removing phosphor material (e.g., laser ablation, mechanical abrasion, etc.) or by adding phosphor material (e.g., by any of spraying, screen printing, blade coating, jetting, etc.). In some other examples, the color of an LED based illumination device is measured before final assembly. The appropriate change in phosphor content can be realized by either removing phosphor material or by adding phosphor material to the transmissive plate 174 or shaped lens 172. After changing the phosphor content, the LED based illumination device 100 undergoes final assembly where the transmissive window 174 or shaped lens 172 is permanently fixed into position.

Transmissive plate 174 and shaped lens 172 may be constructed from a suitable optically transmissive material (e.g., sapphire, alumina, crown glass, polycarbonate, and other plastics).

Transmissive plate 174 and shaped lens 172 are spaced above the light emitting surface of LEDs 102 by a clearance distance. In some embodiments, separation is desirable to allow clearance for wire bond connections from the LED package submount to the active area of the LED. In some embodiments, a clearance of one millimeter or less is desirable to allow clearance for wire bond connections. In some other embodiments, a clearance of two hundred microns or less is desirable to enhance light extraction from the LEDs 102.

In some other embodiments, the clearance distance may be determined by the size of the LED 102. For example, the size of the LED 102 may be characterized by the length dimension of any side of a single, square shaped active die area. In some other examples, the size of the LED 102 may be characterized by the length dimension of any side of a rectangular shaped active die area. Some LEDs 102 include many active die areas (e.g., LED arrays). In these examples, the size of the LED 102 may be characterized by either the size of any individual die or by the size of the entire array. In some embodiments, the clearance should be less than the size, e.g., the length of a side, of the LED 102. In some embodiments, the clearance should be less than twenty percent of the size of the LED 102. In some embodiments, the clearance should be less than five percent of the size of the LED. As the clearance is reduced, light extraction efficiency may be improved, but output beam uniformity may also degrade.

In some other embodiments, it is desirable to attach transmissive plate 174 or shaped lens 172 directly to the surface of the LED 102. In this manner, the direct thermal contact between transmissive plate 174 or shaped lens 172 and LEDs 102 promotes heat dissipation from LEDs 102. In some other embodiments, the space between mounting board 104 and transmissive plate 174 or shaped lens 172 may be filled with a solid encapsulate material. By way of example, silicone may be used to fill the space. In some other embodiments, the space may be filled with a fluid to promote heat extraction from LEDs 102.

In the embodiment illustrated in FIG. 8, the surface of patterned transmissive plate 174 facing LEDs 102 is coupled to LEDs 102 by an amount of flexible, optically translucent material 177. By way of a non-limiting example, the flexible, optically translucent material 177 may include an adhesive, an optically clear silicone, a silicone loaded with reflective particles (e.g., titanium dioxide (TiO2), zinc oxide (ZnO), and barium sulfate (BaSO4) particles, or a combination of these materials), a silicone loaded with a wavelength converting material (e.g., phosphor particles), a sintered PTFE material, etc. Such material may be applied to couple transmissive plate 174 to LEDs 102 in any of the embodiments described herein.

Figure 10:
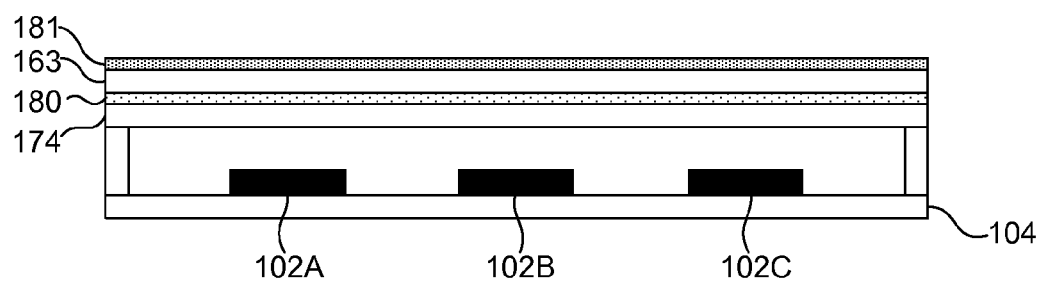
FIG. 10 illustrates a side view of components in another embodiment of an LED based illumination device with multiple transmissive plates.

In some embodiments, multiple, stacked transmissive layers are employed. Each transmissive layer includes different wavelength converting materials. For example, as illustrated in FIG. 10, transmissive layer 174 includes wavelength converting material 180 over the surface area of transmissive layer 174. In addition, a second transmissive layer 163 is placed over and in contact with transmissive layer 174. Transmissive layer 163 includes wavelength converting material 181. In this manner, the color point of light emitted from LED based illumination device 100 may be tuned by replacing transmissive layers 174 and 163 independently to achieve a desired color point. Although, as illustrated in FIG. 10, transmissive layer 163 is placed over and in contact with transmissive layer 174, a space may be maintained between the two elements. This may be desirable to promote cooling of the transmissive layers. For example, airflow may by introduced through the space to cool the transmissive layers.

Figure 11:
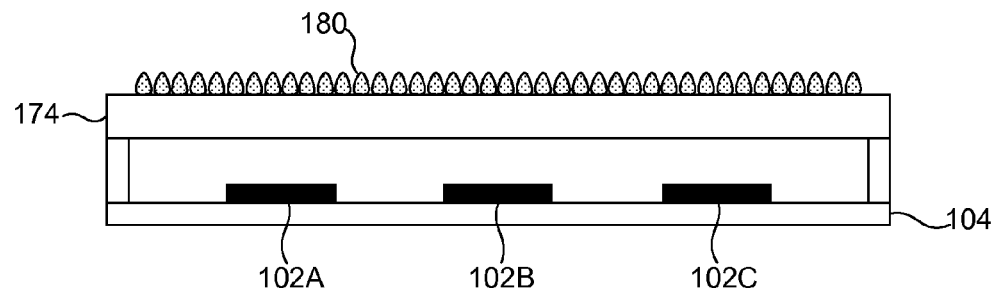
FIG. 11 illustrates a side view of components in another embodiment of an LED based illumination device with droplets of a wavelength converting material uniformly applied to the surface of transmissive layer.

In some embodiments, any of the wavelength converting materials may be applied as a pattern (e.g., stripes, dots, blocks, droplets, etc.). For example, as illustrated in FIG. 11, droplets of wavelength converting material 180 are uniformly applied to the surface of transmissive layer 174. Shaped droplets may improve extraction efficiency by increasing the amount of surface area of the droplet.

Figure 12:
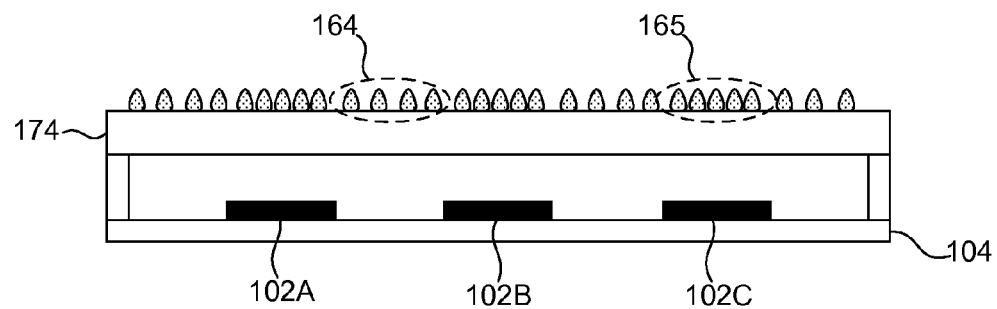
FIG. 12 illustrates a side view of components in another embodiment of an LED based illumination device with droplets of a wavelength converting material applied to the surface of transmissive layer in a non-uniform pattern.

As illustrated in FIG. 12, in some embodiments, droplets of wavelength converting material 180 may be spaced on transmissive layer 174 in a non-uniform pattern. For example, a group of droplets 165 located over LED 102C is densely packed (e.g., droplets in contact with adjacent droplets), while a group of droplets 164 located over a space between LEDs 102A and 102B is loosely packed (e.g., droplets spaced apart from adjacent droplets). In this manner, the color point of light emitted from LED based illumination device 100 may be tuned by varying the packing density of droplets on transmissive layer 174.

Figure 13:
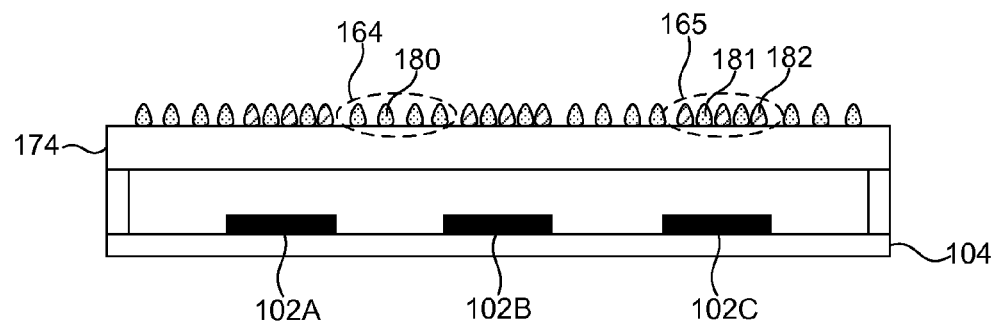
FIG. 13 illustrates a side view of components in another embodiment of an LED based illumination device with droplets of different wavelength converting materials applied to the surface of transmissive layer in a non-uniform pattern.

As illustrated in FIG. 13, in some embodiments, droplets of different wavelength converting materials may be placed in different locations of transmissive layer 174 and may also be placed in a non-uniform pattern. For example, group of droplets 164 may include wavelength converting material 180 and group of droplets 165 may include a combination of droplets including wavelength converting material 181 and wavelength converting material 182. In this manner, combinations of different wavelength converting materials are located relative to LEDs 102 in varying densities to achieve a desired color point of light emitted from LED based illumination device 100.

In the illustrated embodiments, wavelength converting materials are located on the surface of transmissive layer 174. However, in some other embodiments, any of the wavelength converting materials may be embedded within transmissive layer 174.

The area between LEDs 102 and transmissive plate 174 or shaped lens 172 may be filled with a non-solid material, such as air or an inert gas, so that the LEDs 102 emits light into the non-solid material. By way of example, the cavity may be hermetically sealed and Argon gas used to fill the cavity. Alternatively, Nitrogen may be used. In other embodiments, the area between LEDs 102 and transmissive plate 174 or shaped lens 172 may be filled with a solid encapsulate material. By way of example, silicone may be used to fill the cavity. In some other embodiments, color conversion cavity 160 may be filled with a fluid to promote heat extraction from LEDs 102. In some embodiments, wavelength converting material may be included in the fluid to achieve color conversion.

Figure 14:
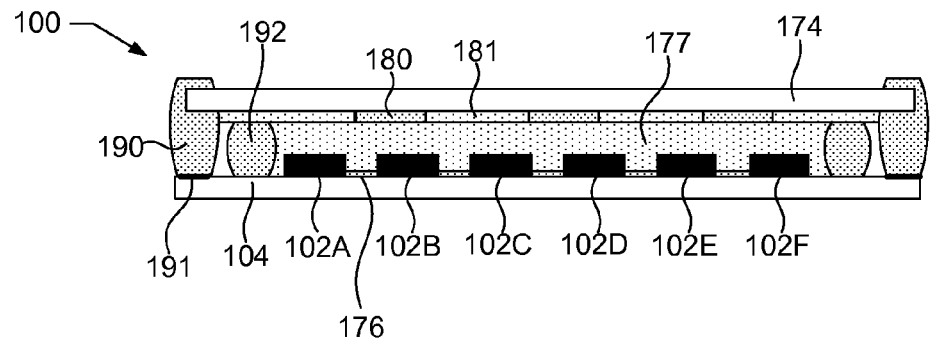
FIG. 14 illustrates a side view of components in another embodiment of an LED based illumination device with a dam of reflective material surrounding the LEDs and supporting a transmissive plate and a dam of thermally conductive material surrounding the dam of reflective material.

FIG. 14 is illustrative of another configuration of LED based illumination device 100, which is similar to that shown in FIG. 8, like designated elements being the same. As illustrated, LED based illumination device 100 includes a number of LEDs 102A-F, collectively referred to as LEDs 102, arranged in a chip on board (COB) configuration. In addition, LED based illumination device 100 includes a base reflector structure including a reflective material 176 (e.g., a white silicone material) disposed in the spaces between each LED, a reflective material structure referred to herein as a dam of reflective material 192 surrounding the LEDs 102 and supporting transmissive plate 174, and a thermally conductive structure referred to herein a dam of thermally conductive material 190 surrounding the dam of reflective material 192. The dam of thermally conductive material 190 is in contact with transmissive plate 174 and is in contact with LED mounting board 104 at thermal interface area 191. In one embodiment, the dielectric surface of LED mounting board 104 is etched away to expose the conductive metal substrate (e.g., copper, aluminum, etc.) over thermal interface area 191.

In some embodiments, the dam of thermally conductive material 190 is spaced apart from the dam of reflective material 192. The space allows excess optically translucent material 177 to pour over the dam of reflective material 192 when transmissive plate 174 is attached without interfering with the thermal connection between thermally conductive material 190 and transmissive plate 174. In some other embodiments, the dam of reflective material is in contact with the dam of thermally conductive material 190. In one example, the reflective material is a flowable material (e.g., silicone based material) that is dispensed within the dam of thermally conductive material 190. The reflective material wicks up the edge of the dam of thermally conductive material 190 to shield the dam of thermally conductive material from exposure to light emitted from LEDs 102. In some embodiments, the dam of thermally conductive material 190 envelopes the edge of transmissive plate 174, which provides a larger surface area of thermal contact and also allows the effective aperture of the LED based illumination device to be defined by the dam of thermally conductive material 190.

Figure 15:
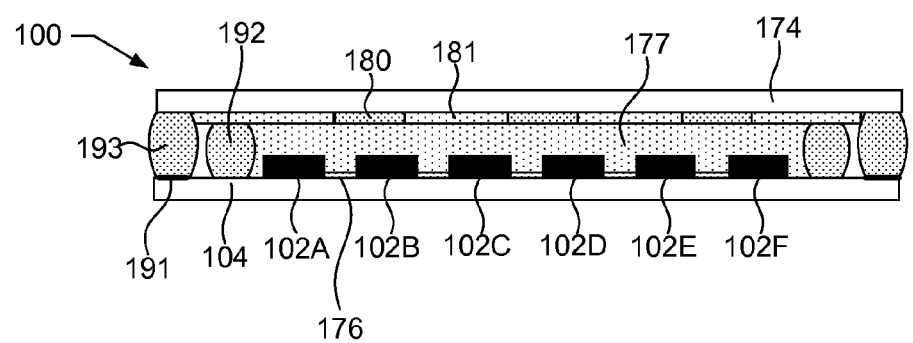
FIG. 15 illustrates a side view of components in another embodiment of an LED based illumination device with a dam of reflective material surrounding the LEDs and supporting a transmissive plate and another embodiment of a dam of thermally conductive material surrounding the dam of reflective material.

FIG. 15 is a diagram illustrating another configuration of LED based illumination device 100, which is similar to that shown in FIG. 14. However, in the embodiment depicted in FIG. 15, the dam of thermally conductive material 193, contacts transmissive plate 174 primarily on the bottom surface, rather than wrapping around the edge of transmissive plate 174 as described with reference to FIG. 14.

In general, the dam of reflective material 192 is constructed from a highly reflective material. The emphasis is on selection of materials with high reflectivity to minimize optical losses in LED based illumination device 100. The thermal conductivity of the highly reflective material 192 is of secondary importance due to the presence of the dam of thermally conductive material 190. In contrast, the dam of thermally conductive material 190 is constructed from a material with high thermal conductivity. The emphasis is on selection of materials with high thermal conductivity to minimize the thermal resistance between transmissive plate 174 and mounting board 104. The reflectivity of the thermally conductive material 190 is of secondary importance due to the presence of the dam of highly reflective material 192 that is in the optical path of LEDs 102. In this manner, a first dam of material, e.g., dam of highly reflective material 192, surrounds the LEDs 102 with the objective of minimizing optical losses, and a second dam of material, e.g., dam of thermally conductive material 190, surrounds the first dam with the objective of focusing on thermal performance. Importantly, the thermal dam is optically shielded from LEDs 102 by the optical dam; hence, the optical performance of the thermal dam is not critical. Rather than being forced to select a dam material that is neither optically nor thermally optimal, this approach allows the designer to choose separate materials, one optimized for optical performance, and the other optimized for thermal performance for each respective dam of material.

Figure 16:
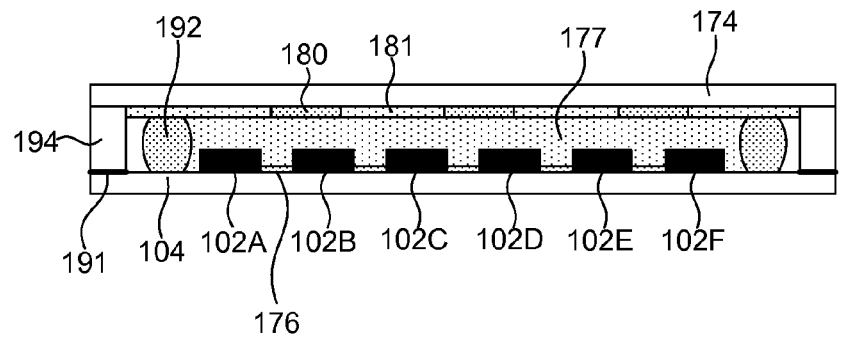
FIG. 16 illustrates a side view of components in another embodiment of an LED based illumination device with a dam of reflective material surrounding the LEDs and supporting a transmissive plate and another embodiment of a dam of thermally conductive material surrounding the dam of reflective material.

In some embodiments, the dam of reflective material 192 is a highly reflective silicone, and the dam of thermally conductive material 190 is a thermally conductive silicone. However, other materials may be contemplated. For example, as illustrated in FIG. 16, which is similar to the embodiment illustrated in FIG. 14, the dam of thermally conductive material 194 is a thermally conductive metal bonded to transmissive plate 174 and mounting board 104. In some embodiments, the dam of thermally conductive material 194 is aluminum or copper. Other thermally conductive materials may be contemplated. The thermally conductive metal may be bonded to transmissive plate 174 and mounting board 104 by a solder joint, a frit seal, an epoxy, or any other suitable bonding material.

In one example, LED based illumination device 100 is constructed in part by bonding the dam of thermally conductive material 190 to LED mounting board. For example, the dam of thermally conductive material 190 is a metal structure (e.g., nickel plated aluminum, copper, etc.) that is bonded onto LED board 104 (e.g., reflow solder, epoxy, etc.). The LED board 104 is populated with LEDs 102 and electrical connections are made between the LED die and LED board 104. Flowable, reflective material is deposited within the dam of thermally conductive material 190 and in the space between the LEDs 102. The reflective material wicks up the edge of the dam of thermally conductive material 190 to shield the dam of thermally conductive material from exposure to light emitted from LEDs 102. The transmissive plate 174 is bonded to the dam of thermally conductive material 190 (e.g., using glue, epoxy, etc.).

Figure 17:
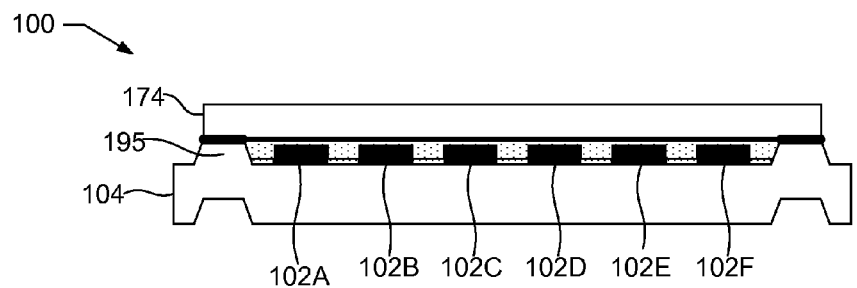
FIG. 17 illustrates a side view of components in another embodiment of an LED based illumination device with another embodiment of a dam of reflective material surrounding the LEDs and supporting a transmissive plate.

FIG. 17 is illustrative of another configuration of LED based illumination device 100. As illustrated, LED based illumination device 100 includes a number of LEDs 102A-F, collectively referred to as LEDs 102, arranged in a chip on board (COB) configuration. The spaces between each LED are filled with a reflective material 176 (e.g., a white silicone material). In addition, a dam of reflective material 195 surrounds the LEDs 102 and supports transmissive plate 174. The space between LEDs 102 and transmissive plate 174 is filled with an encapsulating optically translucent material 177 (e.g., silicone) to promote light extraction from LEDs 102 and to separate LEDs 102 from the environment. In the depicted embodiment, the dam of reflective material 195 is both the thermally conductive structure that conducts heat from transmissive plate 174 to LED mounting board 104 and the optically reflective structure that reflects incident light from LEDs 102 toward transmissive plate 174. The dam of reflective material 195 is generated by punching or coining the bottom surface of mounting board 104 to create a protrusion on the top surface and a void on the bottom surface of the mounting board 104 opposite the protrusion. The resulting protrusion on the top surface of mounting board 104 serves as the dam of reflective material 195 and provides thermal conductivity between the transmissive plate 174 and the mounting board 104. Mounting board 104 is an insulated metal substrate (e.g., a metal core printed circuit board). By way of non-limiting example, the metal substrate may be aluminum or copper.

Figure 18:
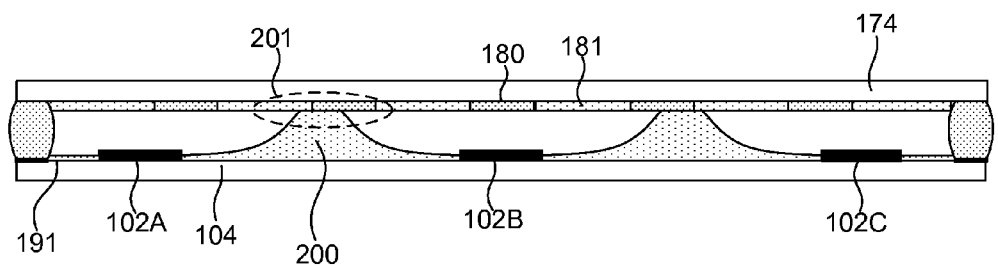
FIG. 18 illustrates a perspective cut-away view of components in another embodiment of an LED based illumination device including another embodiment of a base reflector structure that physically couples a transmissive plate and an LED mounting board.

FIG. 18 is illustrative of another embodiment of a base reflector structure 200, similar to that shown in FIGS. 4-6. As illustrated in FIG. 18, base reflector structure 200 directs light emitted from LEDs 102 to the transmissive plate 174 coated with at least one wavelength converting material (illustrated as wavelength converting materials 180 and 181) and provides a direct thermal path between the transmissive plate 174 and an LED mounting board 104. Base reflector structure 200 is in contact with transmissive plate 174 over an area 201. Area 201 is designed to be large enough to dissipate a significant amount of heat, but not so large as to block a significant portion of light transmitted through transmissive plate 174.

Figure 19:
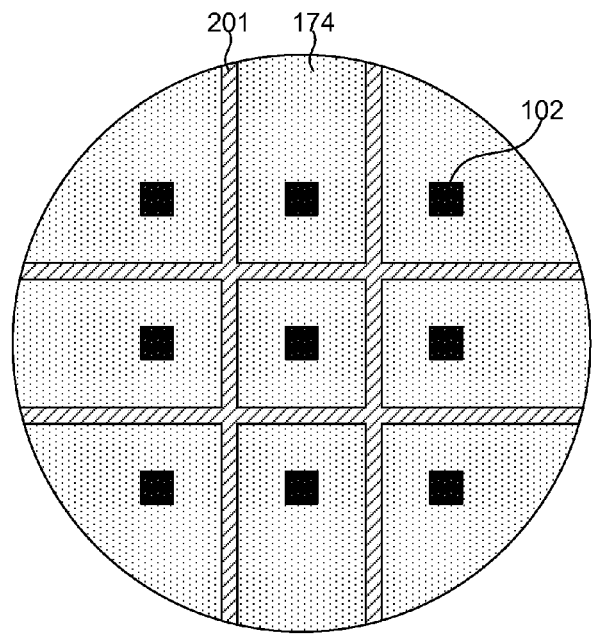
FIG. 19 is a top view of the LED based illumination device illustrated in FIG. 18.

FIG. 19 is a top view of the light emitting device illustrated in FIG. 18. In the illustrated embodiment, LEDs 102 with a 1 mm$^2$ light emitting area are arranged on LED mounting board 104 with a spacing of approximately 4 millimeters. Base reflector structure 200 is arranged in a grid pattern between each LED. The contact area 201 between base reflector structure 200 and transmissive plate 174 has a width of approximately one millimeter, while the distance between transmissive plate 174 and LED mounting board 104 is approximately 0.5 millimeters. In the depicted embodiment, base reflector structure 200 is an optically reflective silicone with a thermal conductivity of approximately 1 W/mK. This configuration allows a significant amount of heat to be conducted from transmissive plate 174 to LED mounting board 104 through base reflector structure 200.

In general, base reflector structure 200 is constructed from a reflective material with high thermal conductivity. In some embodiments, a highly reflective, thermally conductive silicone material is employed. By controlling the spatial distribution of the silicone as it is dispensed on LED mounting board 104, a cup-like shape can be formed around the LEDs 102. In this manner, large angle light emission from the LEDs 102 is directed toward transmissive plate 174 by base reflector structure 200.

In another aspect, transmissive plate 174 is coupled to LED mounting board 104 by a thermally conductive structure and an optically reflective structure to promote heat transfer from transmissive plate 174 to mounting board 104 and to promote light extraction from the LED based illumination device.

Although certain specific embodiments are described above for instructional purposes, the teachings of this patent document have general applicability and are not limited to the specific embodiments described above. For example, although LED based illumination device 100 is depicted as emitting from the top of the device (i.e., the side opposite the LED mounting board 104), in some other embodiments, LED based illumination device 100 may emit light from the side of the device (i.e., a side adjacent to the LED mounting board 104). In another example, any component of LED based illumination device 100 may be patterned with phosphor. Both the pattern itself and the phosphor composition may vary. In one embodiment, the illumination device may include different types of phosphors that are located at different areas of LED based illumination device 100. For example, a red phosphor may be located on the bottom side of transmissive plate 174 and yellow and green phosphors may be located on the top of transmissive plate 174. In one embodiment, different types of phosphors, e.g., red and green, may be located on different areas on transmissive plate 174 or shaped lens 172. For example, one type of phosphor may be patterned on transmissive plate 174 or shaped lens 172 at a first area, e.g., in stripes, spots, or other patterns, while another type of phosphor is located on a different second area of on transmissive plate 174 or shaped lens 172. If desired, additional phosphors may be used and located in different areas. Additionally, if desired, only a single type of wavelength converting material may be used and patterned on transmissive plate 174 or shaped lens 172. In another example, LED based illumination device 100 is depicted in FIGS. 1-3 as a part of a luminaire 150. As illustrated in FIG. 3, LED based illumination device 100 may be a part of a replacement lamp or retrofit lamp. But, in another embodiment, LED based illumination device 100 may be shaped as a replacement lamp or retrofit lamp and be considered as such. Accordingly, various modifications, adaptations, and combinations of various features of the described embodiments can be practiced without departing from the scope of the invention as set forth in the claims.

What is claimed is:

1. An LED based illumination device comprising:
a plurality of LEDs;
an optically transmissive element disposed above the plurality of LEDs, the optically transmissive element includes a first amount of a first wavelength converting material configured to change a wavelength of an amount of light emitted by the plurality of LEDs; and
an LED mounting board of thermally conductive material having a first side and a second side that is opposite the first side, the plurality of LEDs mounted on the first side of the LED mounting board, the LED mounting board having a protrusion of the LED mounting board that projects from the first side of the LED mounting board surrounding the plurality of LEDs and an indentation opposite the protrusion in the second side of the LED mounting board, wherein the LED mounting board is coupled to the optically transmissive element at the protrusion.

2. The LED based illumination device of claim 1, wherein the protrusion is formed on the first side of the LED mounting board by forming the indentation on the second side of the LED mounting board.

3. The LED based illumination device of claim 1, wherein the optically transmissive element is a transmissive plate.

4. The LED based illumination device of claim 1, wherein the optically transmissive element is a shaped lens element.

5. The LED based illumination device of claim 1, further comprising:
an encapsulant material disposed between the plurality of LEDs and the optically transmissive element.

* * * * *